United States Patent
Wu

(10) Patent No.: US 10,019,027 B2
(45) Date of Patent: Jul. 10, 2018

(54) DIRECT DIGITAL SYNTHESIZING METHOD AND DIRECT DIGITAL SYNTHESIZER

(71) Applicant: CSMC TECHNOLOGIES FAB1 CO., LTD., Jiangsu (CN)

(72) Inventor: Huagang Wu, Jiangsu (CN)

(73) Assignee: CSMC TECHNOLOGIES FAB1 CO., LTD., Wuxi New District, Jiangsu (CN)

( * ) Notice: Subject to any disclaimer, the term of this patent is extended or adjusted under 35 U.S.C. 154(b) by 0 days.

(21) Appl. No.: 15/325,855

(22) PCT Filed: Jun. 30, 2015

(86) PCT No.: PCT/CN2015/082902
§ 371 (c)(1),
(2) Date: Jan. 12, 2017

(87) PCT Pub. No.: WO2016/008362
PCT Pub. Date: Jan. 21, 2016

(65) Prior Publication Data
US 2017/0163271 A1 Jun. 8, 2017

(30) Foreign Application Priority Data

Jul. 16, 2014 (CN) .......................... 2014 1 0340412

(51) Int. Cl.
*G06F 1/03* (2006.01)
*H03L 7/16* (2006.01)

(52) U.S. Cl.
CPC .............. *G06F 1/0321* (2013.01); *H03L 7/16* (2013.01)

(58) Field of Classification Search
CPC .......... G06F 1/022; G06F 1/03; G06F 1/0321; G06F 1/0328; G06F 1/0335; H03L 7/16
(Continued)

(56) References Cited

U.S. PATENT DOCUMENTS 5,406,584 A * 4/1995 Erisman .............. H04L 25/4902
332/100
5,467,294 A * 11/1995 Hu ...................... G01R 31/2841
327/106
(Continued)

FOREIGN PATENT DOCUMENTS

| CN | 101149630 | 3/2008 |
| CN | 102082571 | 6/2011 |
| CN | 102324933 | 1/2012 |

OTHER PUBLICATIONS

International Search Report dated Sep. 21, 2015 for PCT/CN2015/082902, 6 pages. In English and Chinese.

*Primary Examiner* — William Hernandez
(74) *Attorney, Agent, or Firm* — Hamre, Schumann, Mueller & Larson, P.C.

(57) ABSTRACT

A direct digital frequency synthesis method comprises the following steps: calculating, by a phase accumulation module, a first phase according to a frequency synthesis word (S101); finding an amplitude value by a preset sinusoidal lookup table according to the first phase (S102); finding a second phase by a preset phase lookup table according to the amplitude value (S103); if the second phase is less than the first phase, adjusting and outputting the amplitude value (S105); or else, outputting the original amplitude value (S106); and performing, by a digital-to-analog converter, a digital-to-analog conversion according to the output amplitude value to obtain a sinusoidal wave (S107); wherein, for a N-bit phase accumulation module and a D-bit digital-to-analog converter, the preset phase lookup table has $2^{D-1}-1$ phase boundary value records corresponding to $0 \sim 2^{D-1}-2$ amplitudes, each phase boundary value is stored in N-2 bits. A direct digital frequency synthesizer applying the above method is also disclosed.

9 Claims, 4 Drawing Sheets

(58) Field of Classification Search
USPC .................................... 327/105, 106, 107
See application file for complete search history.

(56) References Cited

U.S. PATENT DOCUMENTS

| | | | | |
|---|---|---|---|---|
| 6,333,649 | B1* | 12/2001 | Dick .................. | G06F 1/0328 327/105 |
| 2007/0040615 | A1* | 2/2007 | Ammar ................ | G06F 1/0328 331/2 |
| 2007/0164793 | A1 | 7/2007 | Kim | |
| 2008/0109503 | A1* | 5/2008 | Gross .................. | G06F 1/0328 708/275 |

* cited by examiner

DIRECT DIGITAL SYNTHESIZING METHOD AND DIRECT DIGITAL SYNTHESIZER

FIELD OF THE INVENTION

The present invention relates to digital signal processing, and particularly relates to a direct digital frequency synthesis method and a direct digital frequency synthesizer.

BACKGROUND OF THE INVENTION

In some applications that the frequency of the sinusoidal wave needs to be adjusted, adjustability for the frequency is demanding. For example, adjustment of the resonant frequency of the gyroscope sensor of PZT architecture. Adjustability for the frequency thereof reaches below 0.1 Hz. DDS (Direct Digital Synthesizer) provides a method of accurately controlling the sinusoidal frequency in a digital manner.

The working principle of DDS is that based on the characteristic that the sinusoidal wave circulates once in every $2\pi$ phase angle, the $0\sim2\pi$ phase is evenly divided into $2^N$ units by using the phase accumulation module (N-bit), and then according to different requirements for frequency, an angle of frequency word is added into the phase accumulation module at regular intervals. The signal amplitude can be obtained by the sinusoidal lookup table from the phase angle output by the phase accumulation module, and output the sinusoidal wave by the digital-to-analog conversion, wherein the overflow of the phase accumulation module represents a circulation of a $2\pi$ phase angle.

For an adjustment in which a frequency word is M, after processing of the N-bit phase accumulation module, the resulting frequency $f_o$ of the sinusoidal wave of DDS and the working fundamental frequency have the following relationship:

$$f_o = (M \times f_c)/2^N$$

When $2^N/M$ is an integral, the phase truncation will not occur in this adjustment, but in other cases more or less errors will occur due to the phase truncation. Therefore, the frequency accuracy that the conventional DDS can actually output is very limited, and then the application range is also limited.

On the other hand, as described above, generation of the amplitude of the target signal is implemented by the sinusoidal lookup table. On the basis of the conventional DDS, the bit number of the phase can be cut by reducing the phase accumulation and increasing size of the sinusoidal lookup table, and then phase cut error can be reduced. However, depth of the sinusoidal lookup table and the address size has an exponential relation, so a huge sinusoidal lookup table cannot be built in a reasonable cost to reduce the phase error.

SUMMARY OF THE INVENTION

Accordingly, it is necessary to provide a direct digital frequency synthesis method, which can have a lower cost and reduce the phase truncation error.

A direct digital frequency synthesis method includes:
calculating, by a phase accumulation module, a first phase according to a frequency synthesis word;
finding an amplitude value by a preset sinusoidal lookup table according to the first phase;
finding a second phase by a preset phase lookup table according to the amplitude value;
if the second phase is less than the first phase, adjusting and outputting the amplitude value; or else, outputting the original amplitude value; and
performing, by a digital-to-analog converter, a digital-to-analog conversion according to the output amplitude value to obtain a sinusoidal wave;
wherein for a N-bit phase accumulation module and a D-bit digital-to-analog converter, the preset phase lookup table has $2^{D-1}-1$ phase boundary value records corresponding to $0\sim2^{D-1}-2$ amplitudes, each phase boundary value is stored in N-2 bits.

A direct digital frequency synthesizer includes:
a phase accumulation module configured to calculate a first phase according to an input frequency control word;
a sinusoidal computation module configured to calculate an amplitude value according to the first phase;
an amplitude correction module configured to find a second phase by a preset phase lookup table according to the amplitude value derived from the first phase; if the second phase is less than the first phase, the amplitude value is adjusted and output; if the second phase is equal to or greater than the first phase, the amplitude value is output; and
a analog-to-digital conversion module configured to perform a digital-to-analog conversion according to the amplitude value to obtain a sinusoidal wave;
wherein for a N-bit phase accumulation module and a D-bit digital-to-analog converter, the preset phase lookup table has $2^{D-1}-1$ phase boundary value records corresponding to $0\sim2^{D-1}-2$ amplitudes, each phase boundary value is stored in N-2 bits.

Because processing of the conventional DDS always has the phase truncation error, but the above direct digital frequency synthesis method and direct digital frequency synthesizer can reflect the phase truncation degree by comparing and processing the phase again, and compensation can be performed in the case that the phase is truncated much more, for reducing error and improving accuracy. Meanwhile, a plurality of phases usually correspond to a same sinusoidal value in the sinusoidal lookup table, and depth of the sinusoidal lookup table is at least 4 times higher than the resolution of the sinusoidal output. If the truncation error is reduced by increasing accuracy, then the cost will be relatively higher. However, the additional phase lookup table is formed by the manner that one sinusoidal value corresponds to one phase boundary value, therefore, depth of the phase lookup table is commensurate with the resolution of the sinusoidal output, which can efficiently eliminate the phase error based on the required sinusoidal resolution, and the cost will not be much high.

DETAILED DESCRIPTION OF THE EMBODIMENTS

Figure 1:
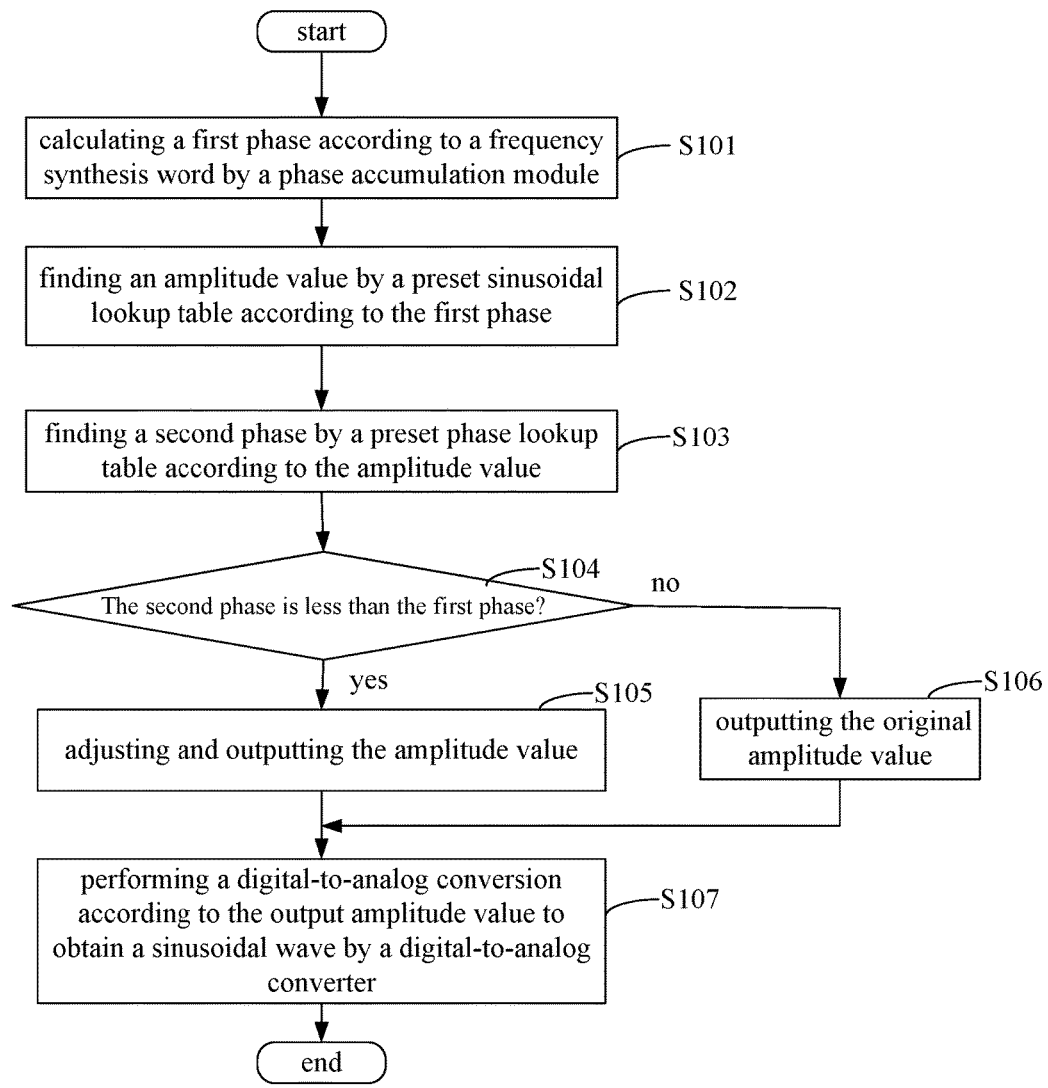
FIG. 1 shows a flow chart of a direct digital frequency synthesis method in an embodiment.

Referring to FIG. 1, in an embodiment, a direct digital frequency synthesis method includes the following steps:

In step S101: a phase accumulation module calculates a first phase according to a frequency synthesis word. In DDS, the frequency synthesis word is also called a frequency control code, which is the data input by the user and configured to control frequency adjustment. The frequency synthesis word is stored in the frequency control register. The phase accumulation module performs the accumulation operation within each clock cycle according to the frequency synthesis word to obtain a phase value which is called a first phase in the embodiment.

In step S102: an amplitude value is looked up by a preset sinusoidal lookup table according to the first phase. The preset sinusoidal lookup table is a lookup table the address of which is the phase and the content of which is the amplitude value. The conventional lookup table is implemented by using the chip having related functions. This will not be discussed herein.

In step S103: a second phase is looked up by a preset phase lookup table according to the amplitude value.

In step S104: the second phase and the first phase are compared, and if the second phase is less than the first phase, then step S105 will be performed; or else, step S106 will be performed.

In step S105: the amplitude value is adjusted and then output. If the second phase is less than the first phase, then it indicates the phase is truncated much more, and then the amplitude value of the phase needs to be compensated to some extent to correspond to the correct phase or a phase which is much more approximate to the correct phase, wherein the compensation value is a constant value.

In step S106: the original amplitude value is output.

In step S107: a digital-to-analog converter performs a digital-to-analog conversion according to the output amplitude value to obtain a sinusoidal wave.

For a N-bit phase accumulation module and a D-bit digital-to-analog converter, the preset phase lookup table includes $2^{D-1}-1$ phase boundary value records corresponding to $0\sim 2^{D-1}-2$ amplitudes, each phase boundary value is stored in N-2 bits.

Because processing of the conventional DDS does not include steps S103~S106, when the amplitude value is obtained, there is always a phase truncation error. However, the phase angle is compared and processed again by steps S103~S106, and then the phase truncation degree can be reflected. Therefore, compensation can be performed in the case that the phase is truncated much more, for reducing error and improving accuracy. Meanwhile, a plurality of phases usually correspond to a same sinusoidal value in the sinusoidal lookup table, and depth of the sinusoidal lookup table is at least 4 times higher than the resolution of the sinusoidal output. If the truncation error is reduced by increasing accuracy, then the cost will be relatively higher. However, the additional phase lookup table is formed by the manner that one sinusoidal value corresponds to one phase boundary value, therefore, depth of the phase lookup table is commensurate with the resolution of the sinusoidal output, which can efficiently eliminate the phase error based on the required sinusoidal resolution, and the cost will not be much high.

Figure 2:
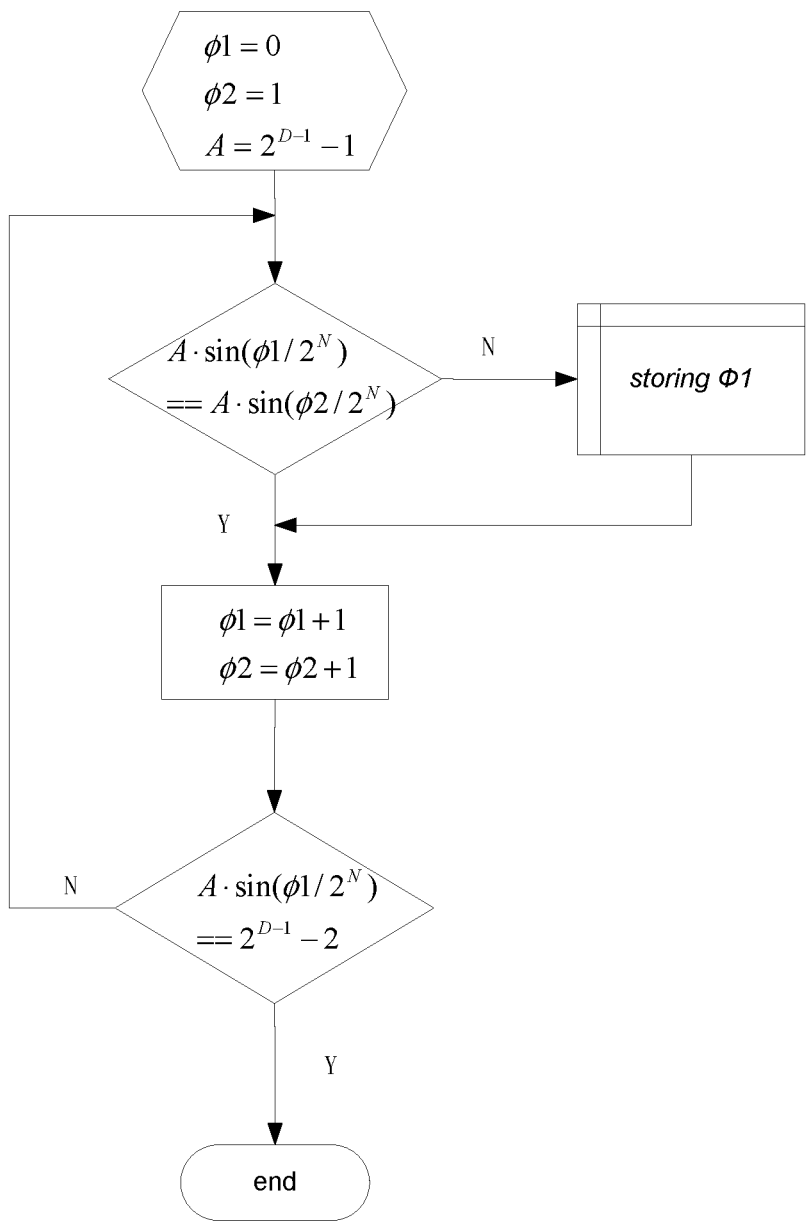
FIG. 2 shows a flow chart of obtaining a phase lookup table.

In the embodiment, referring to FIG. 2, the preset phase lookup table is obtained by using the following method.

$\varphi_1$ and $\varphi_2$ are adjacent numeric values of the phase accumulation module in the first quadrant. Starting from $\varphi_1$ being 0 (at present ($\varphi_2$ being 1), it determines whether $(2^{D-1}-1)\sin(\varphi_1/2^N)$ is equal to $(2^{D-1}-1)\sin(\varphi_2/2^N)$ or not, if $(2^{D-1}-1)\sin(\varphi_1/2^N)$ is not equal to $(2^{D-1}-1)\sin(\varphi_2/2^N)$, last N-2 bits of $\varphi_1$ is stored in the phase lookup table, and after $\varphi_1$ and $\varphi_2$ are increased by 1 at the same time, it determines whether $(2^{D-1}-1)\sin(\varphi_1/2^N)$ is equal to $(2^{D-1}-1)\sin(\varphi_2/2^N)$ or not again; or else, after $\varphi_1$ and $\varphi_2$ are increased by 1 at the same time, it determines whether $(2^{D-1}-1)\sin(\varphi_1/2^N)$ is equal to $(2^{D-1}-1)\sin(\varphi_2/2^N)$ or not again. The above process is repeated until $(2^{D-1}-1)\sin(\varphi_1/2^N)$ is equal to $2^{D-1}-1$).

Further, based on the above method of obtaining the phase lookup table, the phase lookup table can output phases between $0\sim\pi/2$, which only occupy the first quadrant. When the second phase is obtained in step S103, it needs to restore the real phases located from the first quadrant to the fourth quadrant according to most significant two bits of the phase accumulation module and phase values between $0\sim\pi/2$ output by the phase lookup table. Most significant two bits of the phase accumulation module can differentiate four cases by using 00, 10, 01, 11, each corresponds to which of four quadrants the phase angle is located in.

Figure 3:
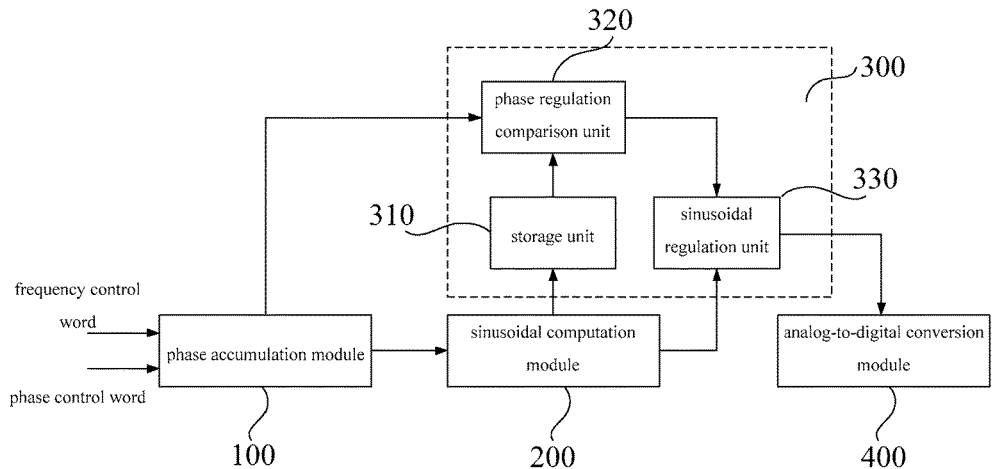
FIG. 3 shows a block diagram of a direct digital frequency synthesizer in an embodiment.

In an embodiment, a direct digital frequency synthesizer is as shown in FIG. 3. The direct digital frequency synthesizer 10 includes a phase accumulation module 100, a sinusoidal computation module 200, an amplitude correction module 300 and an analog-to-digital conversion module 400. The phase accumulation module 100 is configured to obtain a first phase according to a frequency control word; then the sinusoidal computation module 200 is configured to obtain an amplitude value with a preset sinusoidal lookup table; and then the amplitude correction module 300 is configured to obtain a second phase according to the amplitude value with a preset phase lookup table, and adjust the amplitude value according to difference between the second phase and the first phase to reduce the truncation error of the first phase.

The phase accumulation module 100 calculates the first phase according to the input frequency control word. In DDS, the frequency synthesis word is also called a frequency control code, which is the data input by the user and configured to control frequency adjustment. The frequency synthesis word is stored in the frequency control register. The phase accumulation module performs the accumulation operation within each clock cycle according to the frequency synthesis word to obtain a phase value which is called a first phase in the embodiment. If necessary, the phase accumulation module 100 is further configured to receive a phase control word to adjust a initial phase.

The sinusoidal computation module 200 is configured to obtain the amplitude value according to the first phase. In the embodiment, the sinusoidal computation module 200 finds the amplitude value according to the first phase by the preset sinusoidal lookup table. The preset sinusoidal lookup table is a lookup table the address of which is the phase and the content of which is the amplitude value. The conventional lookup table is implemented by using the chip having related functions. This will not be discussed herein.

The amplitude correction module 300 is configured to find the second phase by the preset phase lookup table according to the amplitude value derived from the first phase. If the second phase is less than the first phase, the amplitude value is adjusted and then output; or else, the original amplitude value is output.

Particularly, the amplitude correction module includes a storage unit 300, a phase regulation comparison unit 320 and a sinusoidal regulation unit 330. The storage unit 310 is configured to store the phase lookup table; wherein, for a N-bit phase accumulation module 100 and a D-bit digital-to-analog conversion module 400, the preset phase lookup table includes $2^{D-1}-1$ phase boundary value records corresponding to $0\sim 2^{D-1}-2$ amplitudes, each phase boundary value is stored in N-2 bits. Phase values between 0~π/2 and corresponding amplitude values are stored in the phase lookup table; for a plurality of sequentially adjacent phase angles between 0~π/2, if corresponding amplitude values thereof are same, then the corresponding amplitude values and a maximum phase angle among the plurality of sequentially adjacent phase angles are stored correspondingly. For example, if the phase angles $2/2^N$, $3/2^N$, $4/2^N$, $5/2^N$ correspond to the same amplitude value, then $5/2^N$ and the amplitude value are stored correspondingly. The method of obtaining the phase lookup table can be referred to FIG. 2.

The phase regulation comparison unit 320 is configured to obtain the second phase according to the phase lookup table, and compare the second phase with the first phase. The sinusoidal regulation unit 330 is configured to adjust the amplitude value according to a comparison result of the phase regulation comparison unit.

Figure 4:
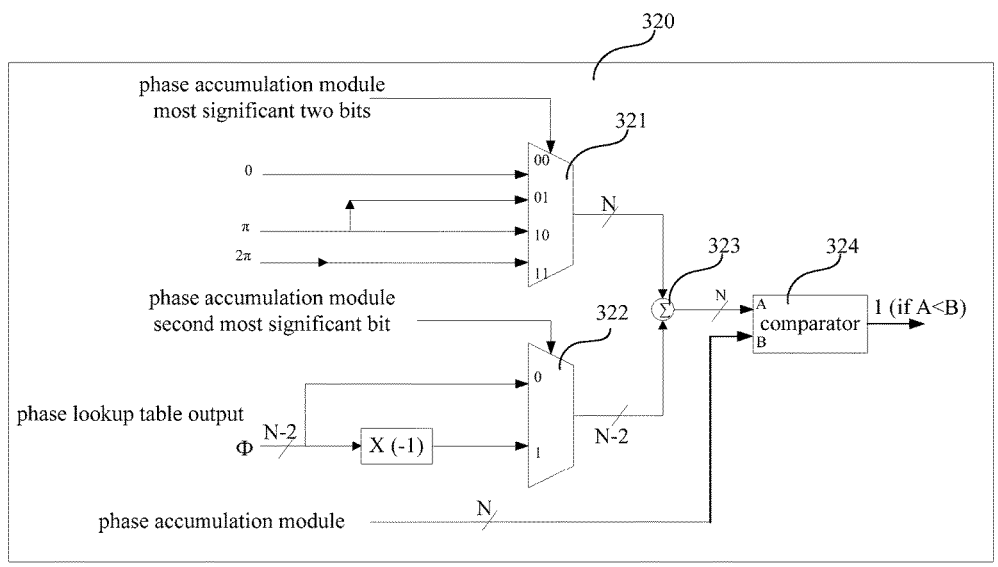
FIG. 4 shows a block diagram of a phase regulation comparison unit in FIG. 3.

Referring to FIG. 4, in the embodiment, the phase regulation comparison unit 320 includes a first selector 321, a second selector 322, a first adder 323 and a comparator 324.

The first selector 321 is configured to select one of 0, π and 2π according to most significant two bits of the phase accumulation module 100, wherein when the most significant two bits are 01 or 10, all outputs of the first selector are π. It can be understood that the selected value and the most significant two bits can have other corresponding relationship.

The second selector 322 is configured to select an original output of the phase lookup table and a negative value of the original output according to a second most significant bit of the phase accumulation module 100. That is to say, the second selector 322 can output φ or –φ.

The first adder 323 is configured to add output results of the first selector 321 and the second selector 322 together.

The comparator 324 is configured to compare an output result of the first adder 323 with an output result of the phase accumulation module 100, and output a comparison result.

It can be seen that when most significant two bits of the phase accumulation module 100 is 01, the second most significant bit thereof is 1, output of the first selector 321 is π, output of the second selector 322 is –φ, and then output of the first adder 323 is π–φ. The phase of the second quadrant can be obtained. Similarly, phases of other quadrants can be obtained.

Figure 5:
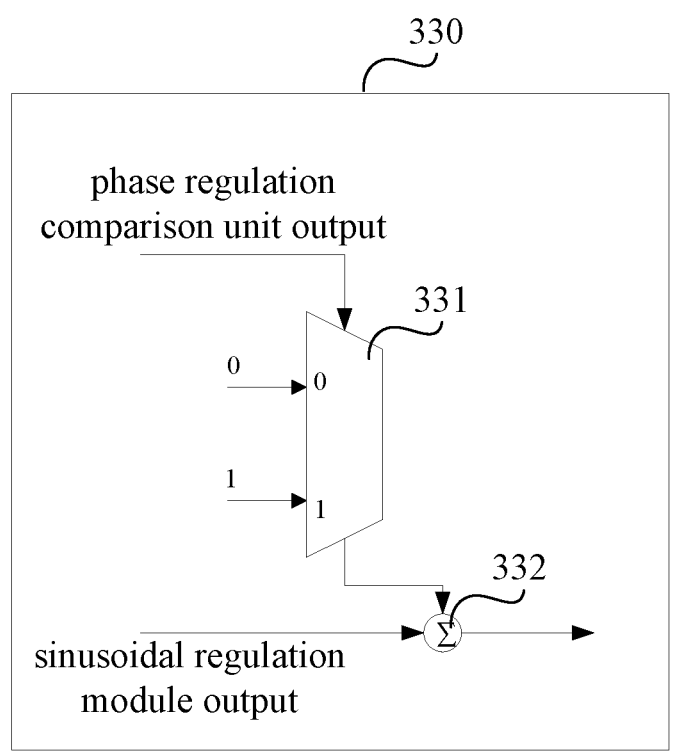
FIG. 5 shows a block diagram of a sinusoidal regulation unit in FIG. 3.

Referring to FIG. 5, in the embodiment, the sinusoidal regulation unit includes a third selector 331 and a second adder 332. The third selector 331 is configured to select a adjustment value according to the comparison result of the phase regulation comparison unit 320. The second adder 332 is configured to add output results of the third selector 331 and the sinusoidal computation module 200 together and output a sum thereof.

The analog-to-digital conversion module 400 is configured to perform a digital-to-analog conversion according to the amplitude value to obtain a sinusoidal wave. The amplitude value can be a corrected amplitude value (indicating the phase is truncated much more), or the original amplitude value (indicating the phase is not truncated much more).

Because processing of the conventional DDS does not include the amplitude correction module 300, when the amplitude value is obtained, there is always a phase truncation error. However, the amplitude correction module 300 can compare and process the phase again to reflect the phase truncation degree, and compensation can be performed in the case that the phase is truncated much more, for reducing error and improving accuracy. Meanwhile, a plurality of phases usually correspond to a same sinusoidal value in the sinusoidal lookup table, and depth of the sinusoidal lookup table is at least 4 times higher than the resolution of the sinusoidal output. If the truncation error is reduced by increasing accuracy, then the cost will be relatively higher. However, the additional phase lookup table is formed by the manner that one sinusoidal value corresponds to one phase boundary value, therefore, depth of the phase lookup table is commensurate with the resolution of the sinusoidal output, which can efficiently eliminate the phase error based on the required sinusoidal resolution, and the cost will not be much high.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A direct digital frequency synthesis method, comprising:
   calculating, by a phase accumulation module, a first phase according to a frequency synthesis word;
   finding an amplitude value by a preset sinusoidal lookup table according to the first phase;
   finding a second phase by a preset phase lookup table according to the amplitude value;
   if the second phase is less than the first phase, adjusting and outputting the amplitude value;
   or else outputting the original amplitude value; and
   performing, by a digital-to-analog converter, a digital-to-analog conversion according to the output amplitude value to obtain a sinusoidal wave,
   wherein the phase accumulation model is an N-bit phase accumulation module and the digital-to-analog converter is a D-bit digital-to-analog converter, the preset phase lookup table has $2^{D-1}-1$ phase boundary value records corresponding to from 0 to $2^{D-1}-2$ amplitudes, and each phase boundary value is stored in N-2 bits.

2. The method of claim 1, further comprising obtaining the preset phase lookup table, comprising:
   $\varphi_1$ and $\varphi_2$ being numeric values, starting from $\varphi_1$ being 0, determining whether $(2^{D-1}-1)\sin(\varphi_1/2^N)$ is equal to $(2^{D-1}-1)\sin(\varphi_2/2^N)$ or not,
   if $(2^{D-1}-1)\sin(\varphi_1/2^N)$ is not equal to $(2^{D-1}-1)\sin(\varphi_2/2^N)$, storing the last N-2 bits of $\varphi_1$ in the preset phase lookup table, and after increasing $\varphi_1$ and $\varphi_2$ by 1 at the same time, determining whether $(2^{D-1}-1)\sin(\varphi_1/2^N)$ is equal to $(2^{D-1}-1)\sin(\varphi_2/2^N)$ or not again;
   or else, after increasing $\varphi_1$ and $\varphi_2$ by 1 at the same time, determining whether $(2^{D-1}-1)\sin(\varphi_1/2^N)$ is equal to $(2^{D-1}-1)\sin(\varphi_2/2^N)$ or not again; and
   repeating the above process until $(2^{D-1}-1)\sin(\varphi_1/2^N)$ is equal to $(2^{D-1}-2)$.

3. The method of claim 2, wherein finding the second phase by the preset phase lookup table according to the amplitude value comprises:
   restoring phase boundary values located from a first quadrant to a fourth quadrant according to two most significant bits of an output from the phase accumulation module and phase values between 0 and π/2 output by the preset phase lookup table.

4. The method of claim 1, wherein adjusting the amplitude value comprises adding a preset value.

5. A direct digital frequency synthesizer, comprising:
   a phase accumulation module configured to calculate a first phase according to an input frequency control word;

a sinusoidal computation module configured to calculate an amplitude value according to the first phase;

an amplitude correction module configured to find a second phase by a preset phase lookup table according to the amplitude value derived from the first phase;

if the second phase is less than the first phase, the amplitude value is adjusted and outputted;

if the second phase is equal to or greater than the first phase, the amplitude value is outputted; and a digital-to-analog converter configured to perform a digital-to-analog conversion according to the amplitude value to obtain a sinusoidal wave;

wherein the phase accumulation module is an N-bit phase accumulation module and the digital-to-analog converter is a D-bit digital-to-analog converter, the preset phase lookup table has $2^{D-1}-1$ phase boundary value records corresponding to from 0 to $2^{D-1}-2$ amplitudes, and each phase boundary value is stored in N-2 bits.

6. The direct digital frequency synthesizer of claim 5, wherein phase values between 0 and π/2 and corresponding amplitude values are stored in the preset phase lookup table; and for a plurality of sequentially adjacent phase angles between 0 and π/2, if corresponding amplitude values thereof are identical, then the corresponding amplitude values and a maximum phase angle among the plurality of sequentially adjacent phase angles are stored correspondingly.

7. The direct digital frequency synthesizer of claim 5, wherein the amplitude correction module comprises:

a storage unit configured to store the preset phase lookup table;

a phase regulation comparison unit configured to obtain the second phase according to the preset phase lookup table, and compare the second phase with the first phase; and a sinusoidal regulation unit configured to adjust the amplitude value according to a comparison result of the phase regulation comparison unit.

8. The direct digital frequency synthesizer of claim 7, wherein the phase regulation comparison unit comprises:

a first selector configured to select a value including one of 0, π, and 2π based on two most significant bits, wherein when the two most significant bits are 01 or 10, all outputs of the first selector are π;

a second selector configured to select an original output of the preset phase lookup table and a negative value of the original output according to a second most significant bit of an output from the phase accumulation module;

a first adder configured to add output results of the first selector and the second selector together; and a comparator configured to compare an output result of the first adder with an output result of the phase accumulation module, and output a comparison result.

9. The direct digital frequency synthesizer of claim 7, wherein the sinusoidal regulation unit comprises:

a third selector configured to select an adjustment value according to the comparison result of the phase regulation comparison unit; and a second adder configured to add output results of the third selector and the sinusoidal computation module together and output a sum thereof.

* * * * *